US012775215B2

(12) United States Patent
Buschlinger et al.

(10) Patent No.: US 12,775,215 B2
(45) Date of Patent: Oct. 27, 2026

(54) METHOD FOR MEASURING AN ILLUMINATION ANGLE DISTRIBUTION ON AN OBJECT FIELD AND ILLUMINATION OPTICS UNIT HAVING AN ILLUMINATION CHANNEL ALLOCATION INTENDED THEREFOR

(71) Applicant: Carl Zeiss SMT GmbH, Oberkochen (DE)

(72) Inventors: Robert Buschlinger, Oberkochen (DE); Michael Ramolla, Oberkochen (DE); Joerg Zimmermann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 92 days.

(21) Appl. No.: 18/923,540

(22) Filed: Oct. 22, 2024

(65) Prior Publication Data

US 2025/0044703 A1 Feb. 6, 2025

Related U.S. Application Data

(63) Continuation of application No. PCT/EP2023/059022, filed on Apr. 5, 2023.

(30) Foreign Application Priority Data

Apr. 27, 2022 (DE) ..................... 10 2022 204 095.3

(51) Int. Cl.
*G03F 7/00* (2006.01)

(52) U.S. Cl.
CPC ...... *G03F 7/70075* (2013.01); *G03F 7/70116* (2013.01); *G03F 7/702* (2013.01)

(58) Field of Classification Search
CPC .. G03F 7/70075; G03F 7/70116; G03F 7/702; G03F 7/706849; G03F 7/70133
See application file for complete search history.

(56) References Cited

U.S. PATENT DOCUMENTS 6,573,978 B1 6/2003 McGuire, Jr.
2006/0132747 A1 6/2006 Singer et al.
(Continued)

FOREIGN PATENT DOCUMENTS

DE 10 2008 009 600 A1 8/2009
DE 102018207384 A1 * 7/2018 ......... G03F 7/70591
(Continued)

OTHER PUBLICATIONS

International Search Report and Written Opinion for corresponding PCT Appl No. PCT/EP2023/059022, dated Jul. 7, 2023.
(Continued)

*Primary Examiner* — Hung V Nguyen
(74) *Attorney, Agent, or Firm* — Fish & Richardson P.C.

(57) ABSTRACT

To measure an illumination angle distribution, which is established via a multiplicity of illumination channels of an illumination optics unit, on an object field via an obscured projection optics unit, a setpoint pupil lighting of an illumination pupil of the illumination optics unit is initially established. With the aid of the setpoint pupil lighting, whether splitting of a measurement pupil lighting into a reflection measurement pupil and a diffraction measurement pupil is desired is checked. Depending on the result of the check, a reflection measurement pupil lighting and/or a diffraction measurement pupil lighting of the illumination optics unit is established by establishing corresponding illumination channels. The reflection measurement pupil lighting is measured by inserting a reflective object into the object field and/or the diffraction measurement pupil lighting is measured by inserting a diffractive object into the object field. An actual pupil lighting is reconstructed from the measurement data.

23 Claims, 2 Drawing Sheets

(56) References Cited

U.S. PATENT DOCUMENTS

| | | | | |
|---|---|---|---|---|
| 2013/0258310 | A1* | 10/2013 | Smilde | G01N 21/956<br>356/237.1 |
| 2015/0323786 | A1 | 11/2015 | Kita | |
| 2018/0074303 | A1 | 3/2018 | Schwab | |

FOREIGN PATENT DOCUMENTS

| | | | | |
|---|---|---|---|---|
| DE | 10 2017 220 586 | A1 | 5/2019 | |
| EP | 1 614 008 | B1 | 12/2009 | |
| EP | 3 629 085 | A1 | 4/2020 | |
| WO | WO 2009/063022 | A1 | 5/2009 | |
| WO | WO-2013143814 | A1 * | 10/2013 | H10W 46/00 |
| WO | WO 2019/096654 | A1 | 5/2019 | |

OTHER PUBLICATIONS

German Office Action, with translation thereof, for corresponding DE Appl No. 10 2022 204 095.3, dated Sep. 1, 2022.

* cited by examiner

METHOD FOR MEASURING AN ILLUMINATION ANGLE DISTRIBUTION ON AN OBJECT FIELD AND ILLUMINATION OPTICS UNIT HAVING AN ILLUMINATION CHANNEL ALLOCATION INTENDED THEREFOR

CROSS-REFERENCE TO RELATED APPLICATIONS

The present application is a continuation of, and claims benefit under 35 USC 120 to, international application No. PCT/EP2023/059022, filed Apr. 5, 2023, which claims benefit under 35 USC 119 of German Application No. 10 2022 204 095.3, filed Apr. 27, 2022. The entire disclosure of each of these applications is incorporated by reference herein.

FIELD

The disclosure relates to a method of measuring an illumination angle distribution, established via a multiplicity of illumination channels of an illumination optics unit, on an object field. The disclosure furthermore relates to an illumination optics unit having an illumination channel allocation carried out using such a method, to an optical system having such an illumination optics unit, to a projection exposure apparatus having such an optical system, to a method for producing a structured component by using such a projection exposure apparatus and to a microstructured or nanostructured component produced by such a method.

BACKGROUND

A method for measuring an illumination angle distribution, established via a multiplicity of illumination channels of an illumination optics unit, on an object field measurement is known from DE 10 2018 207 384 B4.

SUMMARY

The present disclosure seeks to provide a measurement method for a relatively wide application range of illumination angle distributions to be measured.

A selection, dependent on a result of checking the extent to which a pupil lighting is measured with a reflective object and/or with a diffractive object, makes it is possible to use the measurement method in a wide selection range of illumination angle distributions to be measured. Setpoint pupil lightings may also be checked in the case of an obscured projection optics unit for their compliance in an illumination optics unit intended for projection exposure. With a method according to the disclosure, illumination angle distributions and/or intensity distributions dependent on the illumination angle may be measured. For example, using the measurement method it is possible to measure all illumination channels, which provide a pupil lighting of the illumination pupil of the illumination optics unit, with respect to their intensity and/or with respect to their pupil location and/or with respect to their pupil extent. The step of checking the extent to which splitting of the measurement pupil lighting into a reflection measurement pupil and a diffraction measurement pupil is desirable may involve whether a superposition of different diffraction orders takes place in the diffraction measurement pupil. If such a superposition takes place, the measurement of the reflection measurement pupil lighting helps to supplement the measurement of the measurement pupil lighting. If such a superposition of different diffraction orders does not take place, it is possible to measure exclusively with the diffraction measurement pupil. The step of checking with respect to the splitting may furthermore involve whether illumination angles that are actually obscured by the projection optics unit occur with the setpoint pupil lighting. If there is such obscuration, the measurement of the diffraction measurement pupil in the non-zero diffraction orders can help to ascertain, for example, corresponding obscuration illumination angles according to that which is described in DE 10 2018 207 384 B4. If no such obscured illumination angles occur in the setpoint pupil lighting, measurement can be possible exclusively with the reflection measurement pupil. An actual measurement pupil lighting may be established by a selection of the illumination channels using an illumination optics unit having two facet mirrors arranged successively in an illumination light beam path for establishing the illumination channels. Such an illumination optics unit having two facet mirrors arranged successively in the beam path may be configured as a fly's eye condenser having a field facet mirror and a pupil facet mirror. In principle, a different configuration of the illumination optics unit having a plurality of facet mirrors is also possible, for example a specular reflector. The reflective object which is employed in order to measure the reflection measurement pupil lighting may be a reticle blank, that is to say an unstructured, reflective reticle. The diffractive object which is employed in order to measure the diffraction measurement pupil lighting may be a diffraction grating according to the art, which is described in DE 10 2018 207 384 B4. A measurement dynamic range of a measurement detection which is used for measuring the measurement pupil lighting may be at least three orders of magnitude. For the reconstruction of the actual pupil lighting, an influence of a diffraction efficiency and of a diffraction angle for different diffraction orders of the diffractive object may be taken into account during the measurement of the diffraction measurement pupil lighting.

The reconstructed actual pupil lighting can then be compared with the originally established setpoint pupil lighting. The measurement method may therefore involve a comparison of the reconstructed actual pupil lighting with the established setpoint pupil lighting. If this comparison step reveals a difference between the reconstructed actual pupil lighting and the established setpoint pupil lighting which is greater than an established tolerance value, a reconfiguration of the illumination channels, for example a reconfiguration of an illumination channel allocation, may be carried out while using an illumination optics unit having two successively arranged facet mirrors. If the comparison reveals that the actual pupil lighting matches the setpoint pupil lighting within the established tolerance, the measured illumination channel allocation is confirmed as being suitable for the setpoint pupil lighting to be achieved.

In an aspect, the disclosure provides a method of measuring an illumination angle distribution, established via a multiplicity of illumination channels of an illumination optics unit, on an object field in which an object to be imaged can be arranged, via an obscured projection optics unit which is suitable for use in a lithographic projection exposure apparatus. The method includes the following steps: establishing a setpoint pupil lighting of an illumination pupil of the illumination optics unit; checking with the aid of the setpoint pupil lighting whether splitting of a measurement pupil lighting into a reflection measurement pupil and a diffraction measurement pupil is desirable; depending on the result of the check, establishing a reflection measurement pupil lighting and/or a diffraction measurement pupil lighting of the illumination optics unit by establishing corresponding illumination channels inside the illumination optics unit; measuring the reflection measurement pupil lighting by inserting a reflective object into the object field and/or the diffraction measurement pupil lighting by inserting a diffractive object into the object field; and reconstructing an actual pupil lighting from the measurement data obtained during the measurement.

In some embodiments, shadowing effects of the illumination channels are taken into account for the reconstruction. This can increase the reconstruction accuracy and therefore also an optional subsequent comparison accuracy of the method. Such shadowing effects may, for example, occur if facets, which can be switched between different tilt adjustments, of a first facet mirror of the illumination optics unit are used for establishing the illumination channel allocation.

In some embodiments, if both the reflection measurement pupil lighting and the diffraction measurement pupil lighting are measured, the following steps are carried out: establishing all illumination channels that belong to pupil positions which, because of the obscured projection optics unit in a beam path reflected by the object field, starting from the object field, do not reach an image field of the projection optics unit, inside the diffraction measurement pupil lighting; and establishing all illumination channels that belong to pupil positions which, despite the obscured projection optics unit in a beam path reflected by the object field, starting from the object field, do reach an image field of the projection optics unit, inside the reflection measurement pupil lighting. Such an illumination angle establishment can help ensure complete measurement of the measurement pupil lighting.

In some embodiments, if both the reflection measurement pupil lighting and the diffraction measurement pupil lighting are measured, the following steps are carried out:

- establishing at least one reference illumination channel which is used both for the reflection measurement pupil lighting and for the diffraction measurement pupil lighting; and determining an intensity correction factor to assimilate intensities of the measured reflection measurement pupil lighting and the measured diffraction measurement pupil lighting with the aid of intensity measurement data of the at least one reference illumination channel, measured on the one hand via the reflection measurement pupil lighting and on the other hand via the diffraction measurement pupil lighting. Such reference illumination channels can help allow an intensity compensation between the measured reflection measurement pupil lighting and the measured diffraction measurement pupil lighting. A multiplicity of corresponding, established reference illumination channels may be used. Such reference illumination channels may be arranged distributed over an entire pupil of the illumination optics unit to be measured, for example arranged distributed over the setpoint pupil lighting.

In some embodiments, if both the reflection measurement pupil lighting and the diffraction measurement pupil lighting are measured, the following steps are carried out: establishing at least one energy sensor illumination channel which is used both for the reflection measurement pupil lighting and for the diffraction measurement pupil lighting; and taking into account the measurement result of the at least one energy sensor illumination channel for the reconstruction of the actual pupil lighting. Such an approach can allow monitoring of properties of a light source which generates the illumination light for the illumination optics unit. This increases an accuracy of the measurement and, for example, also a compensation accuracy of the measured reflection measurement pupil lighting and the measured diffraction measurement pupil lighting.

In an aspect, the disclosure provides an illumination optics unit having: two facet mirrors arranged successively in an illumination light beam path for establishing illumination channels, for guiding illumination light from a light source to an object field; and a pupil lighting, established via an illumination channel allocation, measured by a method according to a method disclosed herein. Features of such an illumination optics unit correspond to those which have explained above with reference to a measurement method according to the disclosure.

In some embodiments, an illumination optics has an evaluation device for carrying out a method according to the disclosure. Such an evaluation device may comprise measurement detection in the form of, for example, a CCD or CMOS array. The evaluation device may contain an evaluation computer. The measurement detection may be arranged in a pupil plane of a projection optics unit downstream of the illumination optics unit.

In some embodiments, an illumination optics has at least one reflective object for carrying out the measurement of the reflection measurement pupil lighting and/or by at least one diffractive object for carrying out the measurement of the diffraction measurement pupil lighting. Such a reflective object and/or a diffractive object for carrying out measurement of the measurement pupil lightings complements an illumination optics unit with which the measurement method may be carried out. For example, the diffractive object may be adapted, with respect to the diffraction efficiency and/or the diffraction angle in which the diffraction orders occur, to the measurement pupil lighting to be measured. The diffractive object may comprise a diffraction grating. This may, for example, be a blazed grating.

In an aspect, the disclosure provides an optical system, having: an illumination optics unit as disclosed herein; and a projection optics unit for imaging the object field into an image field, in which a wafer can be arranged.

In an aspect, the disclosure provides a projection exposure apparatus having an optical system according to the disclosure and an EUV light source.

In an aspect, the disclosure provides a method of producing a structured component, having the following method steps: providing a reticle and a wafer; projecting a structure on the reticle onto a photosensitive layer of the wafer with the aid of the projection exposure apparatus according to the disclosure; and producing a microstructure and/or nanostructure on the wafer.

In an aspect, the disclosure provides a structured component produced by a production method according to the disclosure.

Features of an optical system according to the disclosure, of a projection exposure apparatus according to the disclosure, of a method for producing a microstructured and/or nanostructured component according to the disclosure, and of a microstructured and/or nanostructured component according to the disclosure, can correspond to those which have already been explained above with reference to the measurement method according to the disclosure and the illumination optics unit according to the disclosure.

A projection optics unit which belongs to the illumination optics unit according to the disclosure for carrying out the measurement method, as a constituent part of the optical system, may be an obscured projection optics unit. A projection optics unit may be a projection optics unit having a numerical aperture on the image side which is greater than 0.5. This numerical aperture on the image side may also be greater than 0.55, may be greater than 0.6, and may be up to 0.7 or even more. An optical system having an illumination optics unit and a projection optics unit may contain an EUV measurement light source. A light source which is also used for the projection exposure may be used as an EUV measurement light source.

A semiconductor component, for example a memory chip, may be produced with the projection exposure apparatus.

BRIEF DESCRIPTION OF THE DRAWINGS

At least one exemplary embodiment of the disclosure is described below with the aid of the drawing. In the drawing.

DETAILED DESCRIPTION

Figure 1:
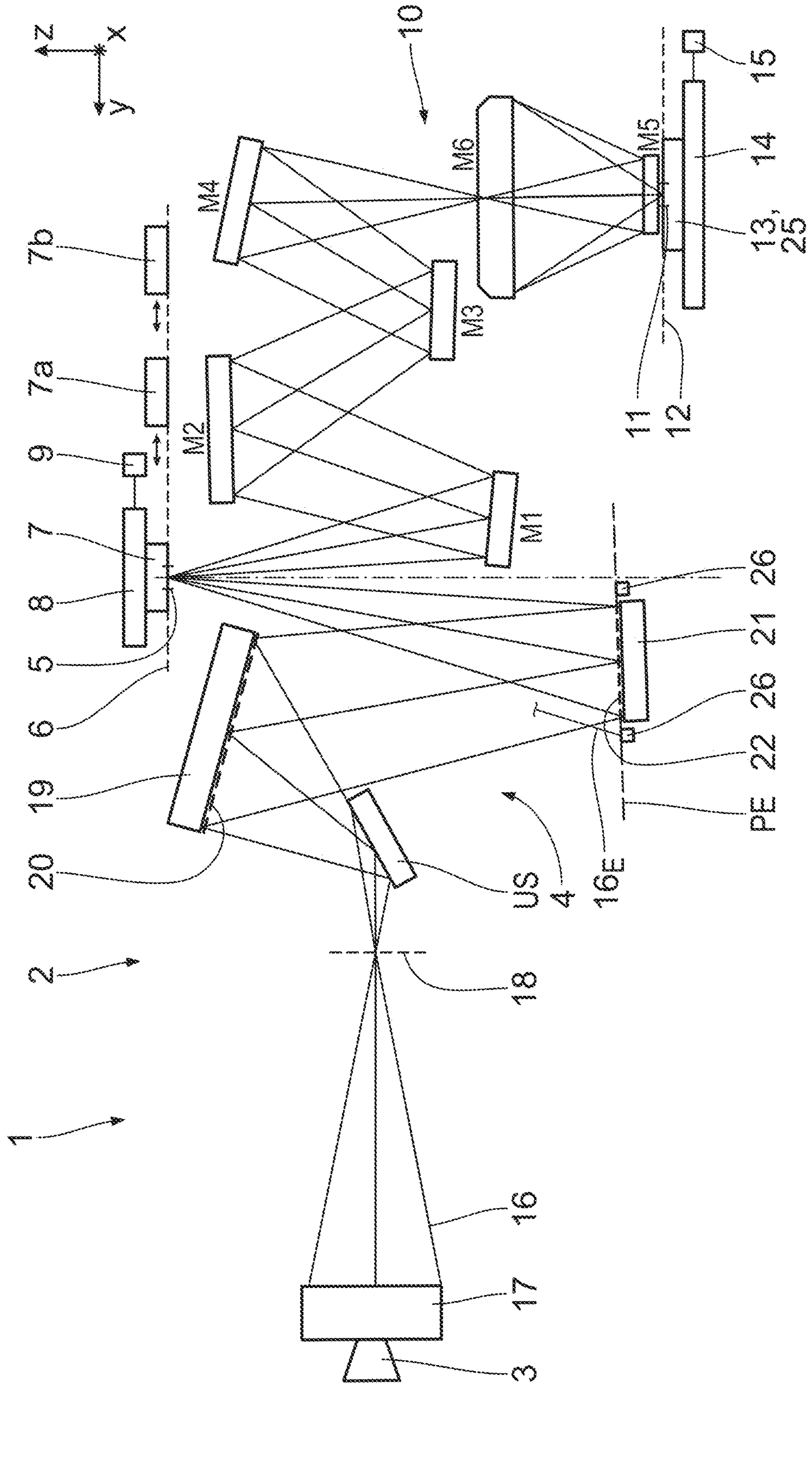
FIG. 1 schematically shows a meridional section of a projection exposure apparatus for EUV projection lithography.

Certain parts of a microlithographic projection exposure apparatus 1 will initially be described by way of example below with reference to FIG. 1. The description of the basic structure of the projection exposure apparatus 1 and its constituent parts is not in this case intended to be restrictive.

Besides a light or radiation source 3, one embodiment of an illumination system 2 of the projection exposure apparatus 1 has an illumination optics unit 4 for illuminating an object field 5 in an object plane 6. In an alternative embodiment, the light source 3 may also be provided as a module separate from the rest of the illumination system. In this case, the illumination system does not comprise the light source 3.

A reticle 7 arranged in the object field 5 is exposed. The reticle 7 is held by a reticle holder 8. The reticle holder 8 is displaceable via a reticle displacement drive 9, such as in a scan direction.

A cartesian xyz coordinate system is indicated in FIG. 1 for explanation. The x direction extends perpendicularly into the plane of the drawing. The y direction extends horizontally and the z direction extends vertically. In FIG. 1, the scan direction extends along the y direction. The z direction extends perpendicularly to the object plane 6.

The projection exposure apparatus 1 comprises a projection optics unit 10. The projection optics unit 10 is used to image the object field 5 into an image field 11 in an image plane 12. The image plane 12 extends parallel to the object plane 6. Alternatively, an angle other than 0° between the object plane 6 and the image plane 12 is also possible.

A structure on the reticle 7 is imaged onto a photosensitive layer of a wafer 13 arranged in the region of the image field 11 in the image plane 12. The wafer 13 is held by a wafer holder 14. The wafer holder 14 is displaceable via a wafer displacement drive 15, for example along the y direction. The displacements, on the one hand of the reticle 7 using the reticle displacement drive 9 and on the other hand of the wafer 13 using the wafer displacement drive 15, may take place in a mutually synchronized way.

The radiation source 3 is an EUV radiation source. The radiation source 3 emits EUV radiation 16, which will also be referred to below as used radiation, illumination radiation, illumination light or imaging light. The used radiation can have a wavelength in the range of between 5 nm and 30 nm. The radiation source 3 may be a plasma source, for example an LPP (Laser Produced Plasma) source or a DPP (Gas Discharged Produced Plasma) source. It may also be a synchrotron-based radiation source. The radiation source 3 may be a free-electron laser (FEL).

The illumination radiation 16 which emanates from the radiation source 3 is collimated by a collector 17. The collector 17 may be a collector having one or more ellipsoidal and/or hyperboloidal reflector faces. The illumination radiation 16 may impinge on the at least one reflection face of the collector 17 in grazing incidence (GI), that is to say with angles of incidence greater than 45°, or in normal incidence (NI), that is to say with angles of incidence less than 45°. The collector 17 may be structured and/or coated, on the one hand in order to optimize its reflectivity for the used radiation and on the other hand in order to suppress stray light.

After the collector 17, the illumination radiation 16 propagates through an intermediate focus in an intermediate focal plane 18. The intermediate focal plane 18 may represent a transition between a radiation source module, comprising the radiation source 3 and the collector 17, and the illumination optics unit 4.

The illumination optics unit 4 comprises a first facet mirror 19. If the first facet mirror 19 is arranged in a plane of the illumination optics unit 4 which is optically conjugate with the object plane 6, it is also referred to as a field facet mirror. The first facet mirror 19 comprises a multiplicity of individual first facets 20, which are also referred to below as field facets. Only some of these facets are represented by way of example in FIG. 1.

The first facets 20 may be configured as macroscopic facets, for example as rectangular facets or as facets having an arcuate or partially circular edge contour. The first facets 20 may be configured as plane facets or, alternatively, as convexly or concavely curved facets.

As is known for example from DE 10 2008 009 600 A1, the first facets 20 themselves may also each be composed of a multiplicity of individual mirrors, for example a multiplicity of micromirrors. The first facet mirror 19 may be configured as a microelectromechanical system (MEMS system). For details, reference is made to DE 10 2008 009 600 A1.

Between the intermediate focus in the intermediate focal plane 18 and the first facet mirror 19, there is a deviating mirror US, which may be configured as a plane mirror or alternatively may also have a collimating effect, in the beam path of the illumination optics unit 4.

In the beam path of the illumination optics unit 4, a second facet mirror 21 is arranged downstream of the first facet mirror 19. If the second facet mirror 21 is arranged in a pupil plane of the illumination optics unit 4, it is also referred to as a pupil facet mirror. The second facet mirror 21 may also be arranged at a distance from a pupil plane of the illumination optics unit 4. In this case, the combination of the first facet mirror 19 and the second facet mirror 21 is also referred to as a specular reflector. Specular reflectors are known from US 2006/0132747 A1, EP 1 614 008 B1 and U.S. Pat. No. 6,573,978.

The second facet mirror 21 comprises a multiplicity of second facets 22. In the case of a pupil facet mirror, the second facets 22 are also referred to as pupil facets.

The second facets 22 may likewise be macroscopic facets, which may for example be round, rectangular or hexagonally edged, or alternatively facets composed of micromirrors. With respect to this, reference is likewise made to DE 10 2008 009 600 A1.

The second facets 22 may comprise plane or, alternatively, convexly or concavely curved reflection faces.

The illumination optics unit 4 therefore forms a doubly facetted system. This underlying principle is also referred to as a fly's eye condenser (fly's eye integrator).

The two facet mirrors 19 and 21 are two facet mirrors arranged successively in the beam path of the illumination light 16 in order to establish illumination channels $16_i$, which guide the illumination light 16 from the light source 3 to the object field 5. Each of these illumination channels $16_i$ of the illumination light 16 is in this case guided by precisely one first facet 20 of the first facet mirror 19 and precisely one second facet 22 of the second facet mirror 21. In an illumination pupil of the illumination optics unit 4, each of these illumination channels $16_i$ forms an illumination spot, which is also abbreviated below to "spot".

In the embodiment represented in FIG. 1, the second facet mirror 21 is arranged in the region of a pupil plane PE of the illumination optics unit 4, and therefore constitutes a pupil facet mirror. It may be advantageous not to arrange the second facet mirror 21 exactly in a plane which is optically conjugate with a pupil plane of the projection optics unit 7. The pupil facet mirror 22 may be arranged tilted relative to a pupil plane of the projection optics unit 7, as is described for example in DE 10 2017 220 586 A1.

With the aid of the second facet mirror 21 and an imaging optical module in the form of a transmission optics unit, the individual first facets 20 are imaged into the object field 5.

The transmission optics unit may comprise precisely one mirror, or alternatively also two or more mirrors which are arranged successively in the beam path of the illumination optics unit 4. The transmission optics unit may comprise one or two normal incidence mirrors (NI mirrors) and/or one or two grazing incidence mirrors (GI mirrors). In the embodiment which is shown in FIG. 1, that is to say after the collector 17, the illumination optics unit 4 has precisely three mirrors, namely the deviating mirror US, the first facet mirror 19 and the pupil facet mirror 21.

If the transmission optics unit after the second facet mirror 21 is omitted, the second facet mirror 21 is the last collimating mirror, or even actually the last mirror, for the illumination radiation 16 in the beam path before the object field 5. An example of an illumination optics unit 4 without a transmission optics unit is disclosed in FIG. 2 of WO 2019/096654 A1.

The imaging of the first facets 20 using the second facets 22, or by the second facets 22 and a transmission optics unit 23, into the object plane 6 is generally only approximate imaging.

The projection optics unit 10 comprises a multiplicity of mirrors Mi, which are numbered according to their arrangement in the beam path of the projection exposure apparatus 1.

In the example represented in FIG. 1, the projection optics unit 10 comprises six mirrors M1 to M8. Alternatives having four, eight, ten twelve or a different number of mirrors Mi are likewise possible. The projection optics unit 10 is an obscured optics unit.

The last mirror M6 has a passage opening for the illumination radiation 16. The projection optics unit 10 has a numerical aperture on the image side which is greater than 0.4, and which may for example be 0.5. The numerical aperture on the image side may also be even greater, may be more than 0.6, and may for example be 0.7 or 0.75.

Reflection faces of the mirrors Mi may be formed as freeform faces without a rotational symmetry axis. Alternatively, the reflection faces of the mirrors Mi may also be configured as aspherical faces having precisely one rotational symmetry axis of the reflection face shape. The mirrors Mi may, like the mirrors of the illumination optics unit 4, have coatings which are highly reflective for the illumination radiation 16. These coatings may be configured as multilayer coatings, for example with alternating coats of molybdenum and silicon.

The projection optics unit 10 may be configured to be anamorphic. It can have different imaging scales $\beta_x$, $\beta_y$ in the x and y directions. The two imaging scales $\beta_x$, $\beta_y$ of the projection optics unit 7 can be $(\beta_x, \beta_y)=(+/-0.25, +/-0.125)$. A positive imaging scale β means imaging without image inversion. A negative sign for the imaging scale β means imaging with image inversion.

In the x direction, that is to say in the direction perpendicular to the scan direction, the projection optics unit 10 leads to a reduction in the ratio 4:1.

In the y direction, that is to say in the scan direction, the projection optics unit 10 leads to a reduction in the ratio 8:1.

Other imaging scales are likewise possible. Imaging scales with the same sign and with the same absolute value in the x and y directions, for example having absolute values of 0.125 or 0.25, are also possible.

The number of intermediate image planes in the x and y directions in the beam path between the object field 5 and the image field 11 may be equal or may be different, depending on the configuration of the projection optics unit 10. Examples of projection optics units having different numbers of such intermediate images in the x and y directions are known from US 2018/0074303 A1.

In each case, one of the pupil facets 22 is allocated to precisely one of the field facets 20 respectively for forming an illumination channel for lighting the object field 5. In this way, for example, illumination according to the Köhler principle may be obtained. The far-field is decomposed with the aid of the field facets 20 into a multiplicity of object fields 5. The field facets 20 generate a multiplicity of images of the intermediate focus on the pupil facets 22 respectively allocated to them.

The field facets 20 are respectively imaged onto the reticle 7 by an allocated pupil facet 22 while being superposed with one another in order to light the object field 5. For example, the lighting of the object field 5 is as homogeneous as possible. It can have a uniformity error of less than 2%. The field uniformity may be achieved by the superposition of different illumination channels.

The field facets 20 of the field facet mirror 19 can be tilted into different tilt adjustments using allocated actuators. In a respective tilt adjustment of the respective field facet 20, the latter is allocated via an illumination channel $16_i$ to a particular facet among the pupil facets 22. The tiltability of the field facets 20 ensures selective allocation of this field facet 20 to a plurality of different facets among the pupil facets 22 and therefore the establishment of different illumination angle distributions, that is to say the establishment of different spot lightings of the illumination pupil. This establishment involves establishing an intensity distribution as a function of an object field illumination angle. The establishment of the illumination angle distribution and/or of the intensity distribution may be dependent on the respectively illuminated object field point, that it to say it may be field-dependent.

The lighting of the entry pupil of the projection optics unit 10 may be defined geometrically by an arrangement of the pupil facets. By selecting the illumination channels, for example the subset of the pupil facets which guide light, the intensity distribution in the entry pupil of the projection optics unit 10 may be adjusted. This intensity distribution is also referred to as an illumination setting or illumination pupil filling.

A likewise preferred pupil uniformity in the region of sections of an illumination pupil of the illumination optics unit 4, which are lit in a defined way, may be achieved by a redistribution of the illumination channels.

Further aspects and details of the lighting of the object field 5, and for example of the entry pupil of the projection optics unit 10, are described below.

The projection optics unit 10 may have a homocentric entry pupil. This may be accessible. It may also be inaccessible.

The entry pupil of the projection optics unit 10 generally cannot be lit exactly with the pupil facet mirror 21. In the case of imaging of the projection optics unit 10 which images the centre of the pupil facet mirror 21 telecentrically onto the wafer 13, the aperture rays often do not intersect at a single point. It is, however, possible to find a surface in which the pairwise determined spacing of the aperture rays is minimal. This surface represents the entry pupil or a face conjugate therewith in position space. For example, this face exhibits a finite curvature.

It may be the case that the projection optics unit 10 has the entry pupil at different places for the tangential and the sagittal beam path. In this case, an imaging element, for example an optical component element of the transmission optics unit 23, should be provided between the second facet mirror 21 and the reticle 7. With the aid of this optical element, the different places of the tangential entry pupil and of the sagittal entry pupil may be taken into account.

In the arrangement of the component parts of the illumination optics unit 4 as represented in FIG. 1, the pupil facet mirror 21 is not arranged in a surface conjugate with the entry pupil of the projection optics unit 10. It is also arranged tilted with respect to the object plane 5. The second facet mirror 21 is furthermore arranged tilted with respect to an arrangement plane which is defined by the first facet mirror 19.

In order to measure an established illumination angle distribution on the object field 5, an evaluation device 25 for measuring a respective pupil lighting of the illumination optics unit 4 and of the projection optics unit 10 may be used instead of the wafer 13 in the projection exposure apparatus 1. The evaluation device 25 may comprise a diaphragm at the location of the image field 11 in the image plane 12 and position-resolved measurement detection at the location of a downstream pupil plane, which is conjugate with the pupil plane PE of the illumination optics unit 4. The diaphragm of the evaluation device 25 may be displaceable along the x direction and/or along the y direction via corresponding actuators in order to establish a measurement field point. The measurement detection of the evaluation device 25 may, for example, be configured as a CCD or CMOS array. A measurement dynamic range of the measurement detection of the evaluation device 25 may be three orders of magnitude, and may also be greater, that is to say may be for example four orders of magnitude or even five orders of magnitude.

In order to measure the illumination angle distribution, either an unstructured, reflective reticle blank or a diffraction grating for deflecting the illumination light 16 is furthermore used at the location of the reticle 7. For this purpose, the reticle displacement drive 9 may be configured as a changer device, which alternates between a reticle blank, that is to say an unstructured, reflective object, and a diffraction grating, that is to say a diffractive object, at the location of the object field 5. The use of a corresponding diffractive object is known from DE 10 2018 207 384 B4. Such a reflective object is indicated in FIG. 1 at 7*a*, and such a diffractive object is indicated in FIG. 1 at 7*b*. Using such a changer device, an imaging, structured reticle may also be used in the manner of the reticle 7 at the location of the image field 5.

Additional energy sensors 26 for monitoring a status of the light source 3 may be arranged in the region of the pupil plane PE of the illumination optics unit 4. A light fraction of the illumination light 16 may be diverted onto these energy sensors 26 via correspondingly tilted field facets 20, which then do not contribute to the object field exposure. Such illumination channels to the energy sensors 26 are also referred to as energy sensor illumination channels $\mathbf{16}_E$.

A method for measuring the illumination angle distribution on the object field 5 is described below with the aid of FIG. 2. Component parts and functions which have already been explained above with reference to FIG. 1 have the same reference numerals and will not be discussed in detail again.

In the measurement method, a setpoint pupil lighting 27 of an illumination pupil 28 in the pupil plane PE is initially established. In the example of FIG. 2, the setpoint pupil lighting 27 is conventional pupil lighting, or a conventional illumination setting, in which comparatively small illumination angles close to normal incidence on the object field 5 are selected with the illumination angles possible in principle inside the illumination pupil 28. The individual spots $\mathbf{16}_i$, which respectively represent one of the illumination channels, are closely packed together in a central region of the illumination pupil 28. Depending on the establishment, a different illumination setting may also be selected as the setpoint pupil lighting 27, for example an annular illumination setting, an x-dipole or y-dipole illumination setting, or a multipole illumination setting, for example a quadrupole illumination setting.

After this step of establishing the setpoint pupil lighting 27, whether splitting of a measurement pupil lighting into a reflection measurement pupil 29 and a diffraction measurement pupil 30 is desirable is checked in the scope of the measurement method with the aid of this setpoint pupil lighting 27. This splitting is illustrated in the second column of FIG. 2.

The reflection measurement pupil 29 is present when the reflective object 7*a* is used in the object field 5. The diffraction measurement pupil 30 is present when the diffractive object 7*b* is used in the object field 5.

The checking of the desirability of splitting may involve whether a superposition of different diffraction orders in a pupil plane downstream of the diffractive object 7*b*, for example in a pupil plane of the projection optics unit 10, takes place after diffraction has occurred at the diffractive object 7*b* in the diffraction measurement pupil 30. If such a superposition is not to be expected, operation may be carried out exclusively with the diffraction measurement pupil 30 as measurement pupil lighting in the subsequent measurement method. Furthermore, when checking the desirability of splitting, whether illumination angles which are obscured by the projection optics unit 10 occur with the setpoint pupil lighting 27 is checked. If this were not the case, operation could be carried out exclusively with the reflection measurement pupil 29 as measurement pupil lighting.

Figure 2:
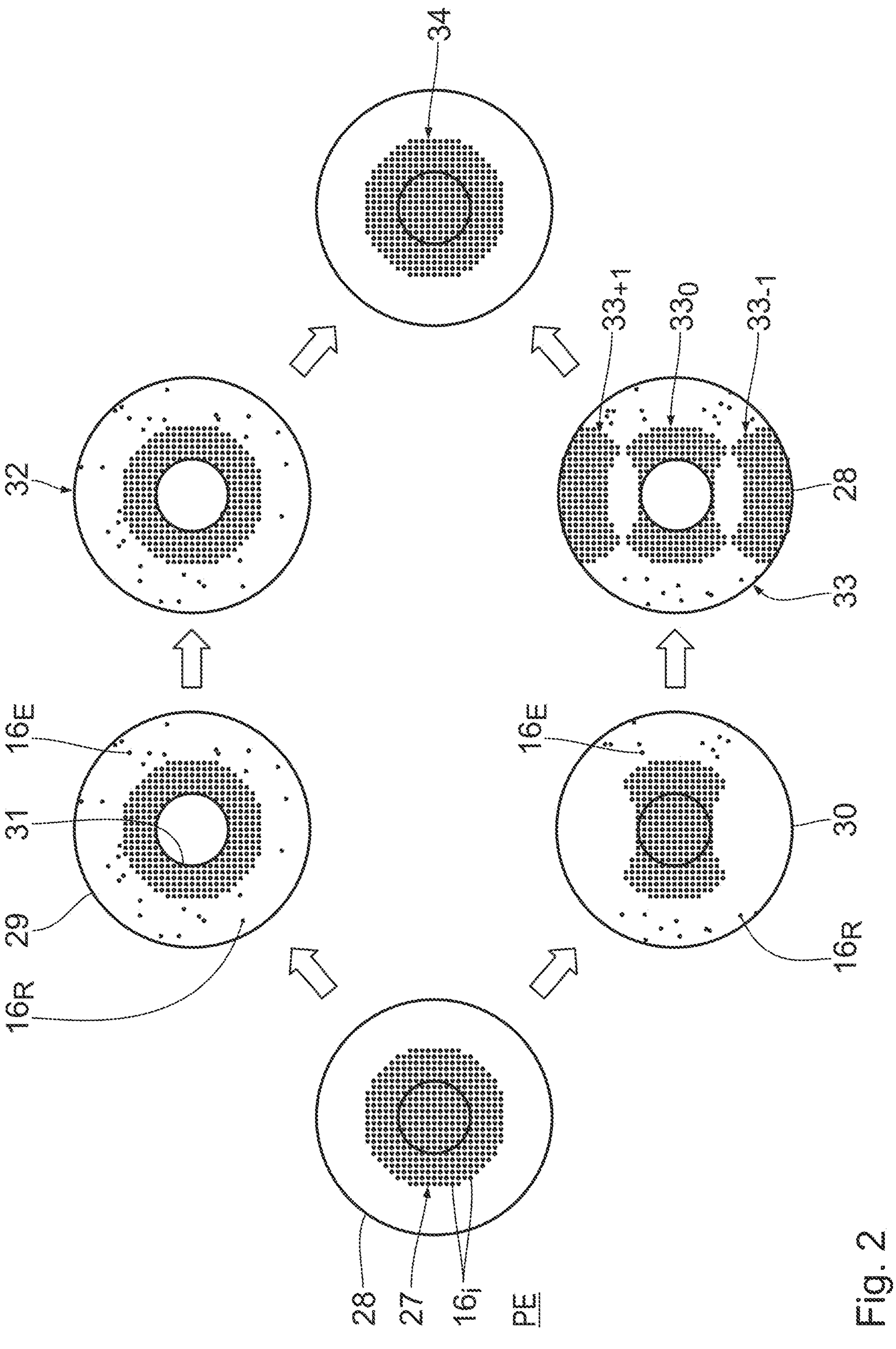
FIG. 2 shows depicts a method for measuring an illumination angle distribution on an object field, which is established using a multiplicity of illumination channels.

In the example selected according to FIG. 2, with the setpoint pupil lighting 27, there are illumination angles at the centre of the illumination pupil 28 which are obscured by the projection optics unit 10. Spots $\mathbf{16}_i$ which belonged to these central, obscured illumination angles are absent from the reflection measurement pupil 29 in an obscuration region 31. In the example according to FIG. 2, splitting of the measurement pupil lighting into the reflection measurement pupil 29 and the diffraction measurement pupil 30 is thus desirable. Correspondingly, the reflection measurement pupil 29 is established as reflection measurement pupil lighting and the diffraction measurement pupil 30 is established as diffraction measurement pupil lighting of the illumination optics unit 4 by establishing corresponding spots $16_i$ with the aid of the facet mirrors 19, 21.

Apart from the obscuration region 31, an inner region of the established reflection measurement pupil lighting 29 corresponds to the setpoint pupil lighting 27. In addition, a plurality of individual spots 16R are also established in the radially outer region of the illumination pupil 28. These are, inter alia, reference illumination channels which are used for intensity comparison both with the reflection measurement pupil lighting 29 and with the diffraction measurement pupil lighting 30. Furthermore, these reference illumination channels distributed statistically inside the illumination pupil 28 allow checking of a lighting homogeneity of the field facets 20.

Inside the reflection measurement pupil lighting 29, all illumination channels $16_i$ that belong to pupil positions which, despite the obscured projection optics unit 10 in an illumination light beam path reflected by the object field 5, starting from the object field 5, do reach the image field of the projection optics unit 10, that is to say which do not belong to the illumination angles obscured by the projection optics unit 10, are established in the inner section of the illumination pupil 28.

Other channels among the illumination channels, which are used both for the reflection measurement pupil lighting 29 and for the diffraction measurement pupil lighting 30, are energy sensor illumination channels $16_E$, which respectively impinge on one of the energy sensors 26 in the pupil plane PE so that a performance of the light source 3 may be monitored during the measurement. Such energy sensor illumination channels $16_E$ allow checking of a lighting homogeneity of the field facets 20 as an alternative or in addition to the reference illumination channels.

Inside the established diffraction measurement pupil lighting 30, all illumination channels $16_i$ that belong to pupil positions which, because of the obscured projection optics unit 10 in an illumination light beam path reflected by the object field 5, starting from the object field 5, do not reach the image field 11 of the projection optics unit 10, are established. The established diffraction measurement pupil lighting 30 contains all spots $16_i$ inside the obscuration region 31 of the setpoint pupil lighting 27.

After establishing of the reflection measurement pupil lighting 29 and the diffraction measurement pupil lighting 30, a measurement of the reflection measurement pupil lighting 29 is carried out in a measurement step of the measurement method by inserting the reflective object 7*a* into the object field 5. A measurement result of the reflection measurement pupil lighting 29 is reproduced in FIG. 2 in the third column at 32.

In the same way, a measurement of the diffraction measurement pupil lighting 30 is carried out during this measurement step by inserting the diffractive object 7*b* into the object field 5. A corresponding measurement result of the diffraction measurement pupil lighting 30 is represented in FIG. 2 in the third column underneath at 33. Besides the zeroth diffraction order $33_0$, there is also a first diffraction order $33_{+1}$ and a minus first diffraction order $33_{-1}$ in the measurement result 33 of the diffraction measurement pupil lighting 30. Spots $16_i$ of these three diffraction orders $33_{-1}$, $33_0$, $33_{+1}$ are superposed with one another inside the measured illumination pupil 28.

After the measurement data of the measurement results 32, 33 have been obtained, a reconstruction of an actual pupil lighting 34 (cf. FIG. 2, right) from these measurement data 32, 33 is carried out during the measurement method.

In the reconstruction of the actual pupil lighting 34, an influence of a diffraction efficiency and of a diffraction angle for the different diffraction orders of the diffractive object 7*b* is taken into account in the evaluation computer of the evaluation device 25. Such a consideration when exclusively using a diffraction measurement pupil is described in DE 10 2018 207 384 A4.

In the reconstruction of the actual pupil lighting 34, shadowing effects between the illumination channels $16_i$, which may occur in the case of neighbouring ones of the field facets 20 because of particular field facet tilt adjustments, are furthermore taken into account.

In the scope of the reconstruction of the actual pupil lighting 34, an intensity correction factor is determined with the aid of the reference illumination channels 16R. This is used to assimilate the intensities of the illumination channels $16_i$ of the measurement results 22, 23 of the reflection measurement pupil lighting 29, on the one hand, and of the measured diffraction measurement pupil lighting 30 on the other hand, with the aid of the obtained intensity measurement data of the reference illumination channels 16R, which have respectively been measured via the two measurement pupil lightings 29 and 30.

In the reconstruction of the actual pupil lighting 34, the measurement result for the energy sensor illumination channels $16_E$ with both measurement pupil lightings 29, 30 is furthermore taken into account, so that a performance influence of the light source 3 is incorporated in the reconstruction step.

The result of the reconstruction is then the actual pupil lighting 34 while including the diffraction effects of the diffractive object 7*b*, while including intensity-influencing differences in the measurement results 32, 33, on the one hand of the measurement of the reflective object 7*a* and on the other hand of the measurement of the diffractive object 7*b*, and while taking into account the performance of the light source 3 and shadowing effects between neighbouring illumination channels $16_i$.

The reconstructed actual pupil lighting 34 is then compared with the established setpoint pupil lighting 27. If this comparison step reveals a setpoint/actual difference which is greater than an established tolerance value, a reconfiguration of the illumination channel allocation, that is to say a reconfiguration of the illumination setting, may be carried out by correspondingly establishing switching adjustments of the field facets 20. The tolerance value may relate to individual spots $16_i$ or to average values for example regions of the setpoint pupil lighting 27. A deviation to be tolerated may, for example, be 2% or 1%.

During the determination of the intensity correction factor for a particular spot 16*i*, for example of the measurement result 33, a ratio of the intensities of all common reference spots 16R of the measurement result 32 to the measurement results of all common reference spots 16R of the measurement result 33 may be formed. This ratio then represents the intensity correction factor.

During the subsequent projection exposure with the aid of the projection exposure apparatus 1, the illumination optics unit 4 is used with an illumination channel allocation measured and optionally optimized according to the measurement method described above.

In order to produce a microstructured or nanostructured component, the projection exposure apparatus 1 is used as follows: initially, the reflection mask 7, or the reticle, and the substrate, or the wafer 13, are provided. Subsequently, a structure on the reticle 7 is projected onto a photosensitive layer of the wafer 13 with the aid of the projection exposure apparatus 1. A microstructure or nanostructure on the wafer 13, and therefore the microstructured component, is then produced by developing the photosensitive layer.

What is claimed is:

1. A method of measuring an illumination angle distribution, established via a multiplicity of illumination channels of an illumination optics unit, on an object field via an obscured projection optics unit configured to use in a lithographic projection exposure apparatus, the method comprising:

establishing a setpoint pupil lighting of an illumination pupil of the illumination optics unit;

checking with the aid of the setpoint pupil lighting whether to split a measurement pupil lighting into a reflection measurement pupil and a diffraction measurement pupil;

depending on the result of the check, establishing a reflection measurement pupil lighting and/or establishing a diffraction measurement pupil lighting of the illumination optics unit by establishing corresponding illumination channels inside the illumination optics unit;

measuring the reflection measurement pupil lighting by inserting a reflective object into the object field and/or measuring the diffraction measurement pupil lighting by inserting a diffractive object into the object field; and reconstructing an actual pupil lighting from the measurement data obtained during the measurement, thereby measuring the illumination angle distribution.

2. The method of claim 1, further comprising taking into account shadowing effects of the illumination channels for the reconstruction.

3. The method of claim 1, comprising:

measuring both the reflection measurement pupil lighting and the diffraction measurement pupil lighting;

establishing all illumination channels that belong to pupil positions which, because of the obscured projection optics unit in a beam path reflected by the object field, starting from the object field, do not reach an image field of the projection optics unit, inside the diffraction measurement pupil lighting; and establishing all illumination channels that belong to pupil positions which, despite the obscured projection optics unit in a beam path reflected by the object field, starting from the object field, do reach an image field of the projection optics unit, inside the reflection measurement pupil lighting.

4. The method of claim 1, comprising:

measuring both the reflection measurement pupil lighting and the diffraction measurement pupil lighting;

establishing at least one reference illumination channel which is used both for the reflection measurement pupil lighting and for the diffraction measurement pupil lighting; and determining an intensity correction factor to assimilate intensities of the measured reflection measurement pupil lighting and the measured diffraction measurement pupil lighting with the aid of intensity measurement data of the at least one reference illumination channel, measured via the reflection measurement pupil lighting and via the diffraction measurement pupil lighting.

5. The method of claim 1, comprising:

measuring both the reflection measurement pupil lighting and the diffraction measurement pupil lighting;

establishing at least one energy sensor illumination channel which is used both for the reflection measurement pupil lighting and for the diffraction measurement pupil lighting; and taking into account the measurement result of the at least one energy sensor illumination channel for the reconstruction of the actual pupil lighting.

6. The method of claim 1, comprising:

taking into account shadowing effects of the illumination channels for the reconstruction;

measuring both the reflection measurement pupil lighting and the diffraction measurement pupil lighting;

establishing all illumination channels that belong to pupil positions which, because of the obscured projection optics unit in a beam path reflected by the object field, starting from the object field, do not reach an image field of the projection optics unit, inside the diffraction measurement pupil lighting; and establishing all illumination channels that belong to pupil positions which, despite the obscured projection optics unit in a beam path reflected by the object field, starting from the object field, do reach an image field of the projection optics unit, inside the reflection measurement pupil lighting.

7. The method of claim 1, comprising:

taking into account shadowing effects of the illumination channels for the reconstruction;

measuring both the reflection measurement pupil lighting and the diffraction measurement pupil lighting;

establishing at least one reference illumination channel which is used both for the reflection measurement pupil lighting and for the diffraction measurement pupil lighting; and determining an intensity correction factor to assimilate intensities of the measured reflection measurement pupil lighting and the measured diffraction measurement pupil lighting with the aid of intensity measurement data of the at least one reference illumination channel, measured via the reflection measurement pupil lighting and via the diffraction measurement pupil lighting.

8. The method of claim 1, comprising:

taking into account shadowing effects of the illumination channels for the reconstruction;

measuring both the reflection measurement pupil lighting and the diffraction measurement pupil lighting;

establishing at least one energy sensor illumination channel which is used both for the reflection measurement pupil lighting and for the diffraction measurement pupil lighting; and taking into account the measurement result of the at least one energy sensor illumination channel for the reconstruction of the actual pupil lighting.

9. The method of claim 1, comprising:

depending on the result of the check, establishing a reflection measurement pupil lighting of the illumination optics unit by establishing corresponding illumination channels inside the illumination optics unit;

measuring the reflection measurement pupil lighting by inserting a reflective object into the object field.

10. The method of claim 9, comprising:

depending on the result of the check, establishing a diffraction measurement pupil lighting of the illumination optics unit by establishing corresponding illumination channels inside the illumination optics unit;

measuring the diffraction measurement pupil lighting by inserting a diffractive object into the object field.

11. The method of claim 1, comprising:

depending on the result of the check, establishing a diffraction measurement pupil lighting of the illumination optics unit by establishing corresponding illumination channels inside the illumination optics unit;

measuring the diffraction measurement pupil lighting by inserting a diffractive object into the object field.

12. The method of claim 1, wherein the illumination optics unit comprises two facet mirrors arranged successively in an illumination light beam path to establish the illumination channels to guide illumination light from a light source to the object field.

13. The method of claim 12, wherein the illumination optics unit comprises an evaluation device to perform the method measuring the illumination angle distribution.

14. The method of claim 13, wherein the illumination optics unit comprises at least one reflective object to perform the measurement of the reflection measurement pupil lighting and/or the illumination optics unit comprises at least one diffractive object to perform the measurement of the diffraction measurement pupil lighting.

15. The method of claim 11, wherein an optical system comprises the illumination optics, and the optical system further comprises a projection optics unit to image the object field into an image field.

16. The method of claim 15, wherein a projection exposure apparatus comprises the optical system, and the projection exposure apparatus further comprises an EUV light source.

17. The method of claim 16, further comprising:

providing a reticle in the object plane and a wafer in the image plane;

projecting a structure of the reticle onto a photosensitive layer of the wafer using the projection exposure apparatus; and producing a microstructure and/or nanostructure on the wafer.

18. The method of claim 1, comprising:

measuring both the reflection measurement pupil lighting and the diffraction measurement pupil lighting;

establishing at least one reference illumination channel which is used both for the reflection measurement pupil lighting and for the diffraction measurement pupil lighting;

determining an intensity correction factor to assimilate intensities of the measured reflection measurement pupil lighting and the measured diffraction measurement pupil lighting with the aid of intensity measurement data of the at least one reference illumination channel, measured via the reflection measurement pupil lighting and via the diffraction measurement pupil lighting;

establishing at least one energy sensor illumination channel which is used both for the reflection measurement pupil lighting and for the diffraction measurement pupil lighting; and taking into account the measurement result of the at least one energy sensor illumination channel for the reconstruction of the actual pupil lighting.

19. The method of claim 18, comprising:

establishing all illumination channels that belong to pupil positions which, because of the obscured projection optics unit in a beam path reflected by the object field, starting from the object field, do not reach an image field of the projection optics unit, inside the diffraction measurement pupil lighting; and establishing all illumination channels that belong to pupil positions which, despite the obscured projection optics unit in a beam path reflected by the object field, starting from the object field, do reach an image field of the projection optics unit, inside the reflection measurement pupil lighting.

20. The method of claim 19, further comprising taking into account shadowing effects of the illumination channels for the reconstruction.

21. The method of claim 1, wherein checking with the aid of the setpoint pupil lighting whether to split the measurement pupil lighting into the reflection measurement pupil and the diffraction measurement pupil comprises determining whether illumination angles that are actually obscured by the projection optics unit occur with the established setpoint pupil lighting.

22. The method of claim 1, wherein:

checking with the aid of the setpoint pupil lighting whether to split the measurement pupil lighting into the reflection measurement pupil and the diffraction measurement pupil comprises determining whether a superposition of diffraction orders takes place in the diffraction measurement pupil; and the method further comprises:

when diffraction orders are superimposed in the diffraction measurement pupil, splitting the measurement pupil lighting into the reflection measurement pupil; and when diffraction orders are not superimposed in the diffraction measurement pupil, not splitting the measurement pupil lighting into the diffraction.

23. The method of claim 1, checking with the aid of the setpoint pupil lighting whether to split the measurement pupil lighting into the reflection measurement pupil and the diffraction measurement pupil comprises determining whether illumination angles that are actually obscured by the projection optics unit occur with the setpoint pupil lighting; and the method further comprises:

when illumination angles that are actually obscured by the projection optics unit occur with the setpoint pupil lighting, splitting the measurement pupil lighting into the reflection measurement pupil; and when illumination angles that are actually obscured by the projection optics unit do not occur with the setpoint pupil lighting, not splitting the measurement pupil lighting into the diffraction.

* * * * *